US011842910B2

(12) United States Patent
Sundar et al.

(10) Patent No.: US 11,842,910 B2
(45) Date of Patent: Dec. 12, 2023

(54) DETECTING OUTLIERS AT A MANUFACTURING SYSTEM USING MACHINE LEARNING

(71) Applicant: APPLIED MATERIALS, INC., Santa Clara, CA (US)

(72) Inventors: Bharath Ram Sundar, Chennai (IN); Raman K Nurani, Chennai (IN); Ramkishore Sankarasubramanian, Kanchipuram (IN); Ramachandran Subramanian, Chennai (IN); Bharath Muralidharan, Chennai (IN); Ramaswamy Melatoor Narayanan, Chennai (IN); Ganapathi Raman Sankaranarayanan, Chennai (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 274 days.

(21) Appl. No.: 17/168,041

(22) Filed: Feb. 4, 2021

(65) Prior Publication Data
US 2022/0246457 A1     Aug. 4, 2022

(51) Int. Cl.
*H01L 21/66*     (2006.01)
*G06N 5/04*     (2023.01)
(Continued)

(52) U.S. Cl.
CPC ......... *H01L 21/67288* (2013.01); *G06N 5/04* (2013.01); *G06N 20/00* (2019.01); *H01L 22/12* (2013.01)

(58) Field of Classification Search
CPC ............... H01L 21/67288; H01L 22/12; H01L 21/67167; G06N 5/04; G06N 20/00; G06N 3/084
See application file for complete search history.

(56) References Cited

U.S. PATENT DOCUMENTS 8,473,089 B2 * 6/2013 Albarede .......... H01J 37/32935
                                                                                  700/121
2021/0402707 A1 * 12/2021 Neumann .............. B33Y 70/00

OTHER PUBLICATIONS

Weiwei Zu et al., "Lp Norm Spectral Regression for Feature Extraction in Outlier Conditions", Conference: 2015 IEEE International Conference on Digital Signal Processing (DSP), https://www.researchgate.net/publication/308813116_Lp_norm_spectral_regression_for_feature_extraction_in_outlier_conditions, Jul. 2015, 4 pages.

(Continued)

*Primary Examiner* — Manuel A Rivera Vargas
(74) *Attorney, Agent, or Firm* — Lowenstein Sandler LLP

(57) ABSTRACT

Methods and systems for detecting outliers at a manufacturing system using machine learning are provided. Data collected by a sensors at a manufacturing system during a current process performed for a first set of substrates is provided as input to a trained machine learning model. One or more outputs are obtained from the trained machine learning model. A first amount of drift of a first set of parameter values for the first set of substrates from a target set of parameter values for the first set of substrates is extracted from the one or more outputs. A second amount of drift of each of the first set of parameter values for the first set of substrates from a corresponding parameter value of a second set of parameter values for a second set of substrates processed according to the current process at the manufacturing system prior to the performance of the current process for the first set of substrates is also extracted from the one or more outputs. A substrate health rating is assigned for each of the first set of substrates based on the first amount of drift. A sensor health rating is assigned for each of the sensors at the manufacturing system based on the second amount of drift. An indication of the substrate health rating for each of the first set of substrates and the sensor health (Continued)

rating for each of the sensors are transmitted to a client device connected to the manufacturing system.

20 Claims, 7 Drawing Sheets

(51) Int. Cl.
  *H01L 21/67* (2006.01)
  *G06N 20/00* (2019.01)

(56) References Cited

OTHER PUBLICATIONS

Masashi Sugiyama, "Outlier Detection", Introduction to Statistical Machine Learning, Science Direct, 2016, 18 pages.

* cited by examiner

DETECTING OUTLIERS AT A MANUFACTURING SYSTEM USING MACHINE LEARNING

TECHNICAL FIELD

Embodiments of the present disclosure relate, in general, to manufacturing systems and more particularly to detecting outliers at a manufacturing system using machine learning.

BACKGROUND

A manufacturing process can be configured to achieve a target substrate quality and consistency. A substrate that does not satisfy the target quality and consistency for the substrate process is referred to as an outlier substrate. In some instances, an outlier substrate is produced based on an anomaly (i.e., a one-time occurrence that deviates from the standard procedure) that occurred during the process. For example, a manufacturing system component can be temporarily defective during the process, causing the production of the outlier substrate. In other instances, an outlier substrate is produced based on a drift of the process away from the target quality and consistency. For example, a defective component can prevent substrates processed at the manufacturing system from achieving the target substrate quality and consistency. It can be difficult for a manufacturing system operator to identify an outlier substrate and/or a drift from the target substrate quality and consistency of the substrate process.

In some instances, a sensor of the manufacturing system can be defective and can generate inaccurate data for substrates during the substrate process. As a result, a manufacturing system controller can flag a substrate as an outlier substrate based on the inaccurate data captured by the defective sensor, even though substrate achieves the target quality and consistency for the process. It can be difficult for the operator of the manufacturing system to identify a defective sensor that is generating inaccurate data for substrates of the manufacturing system.

BRIEF DESCRIPTION OF THE DRAWING

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1:
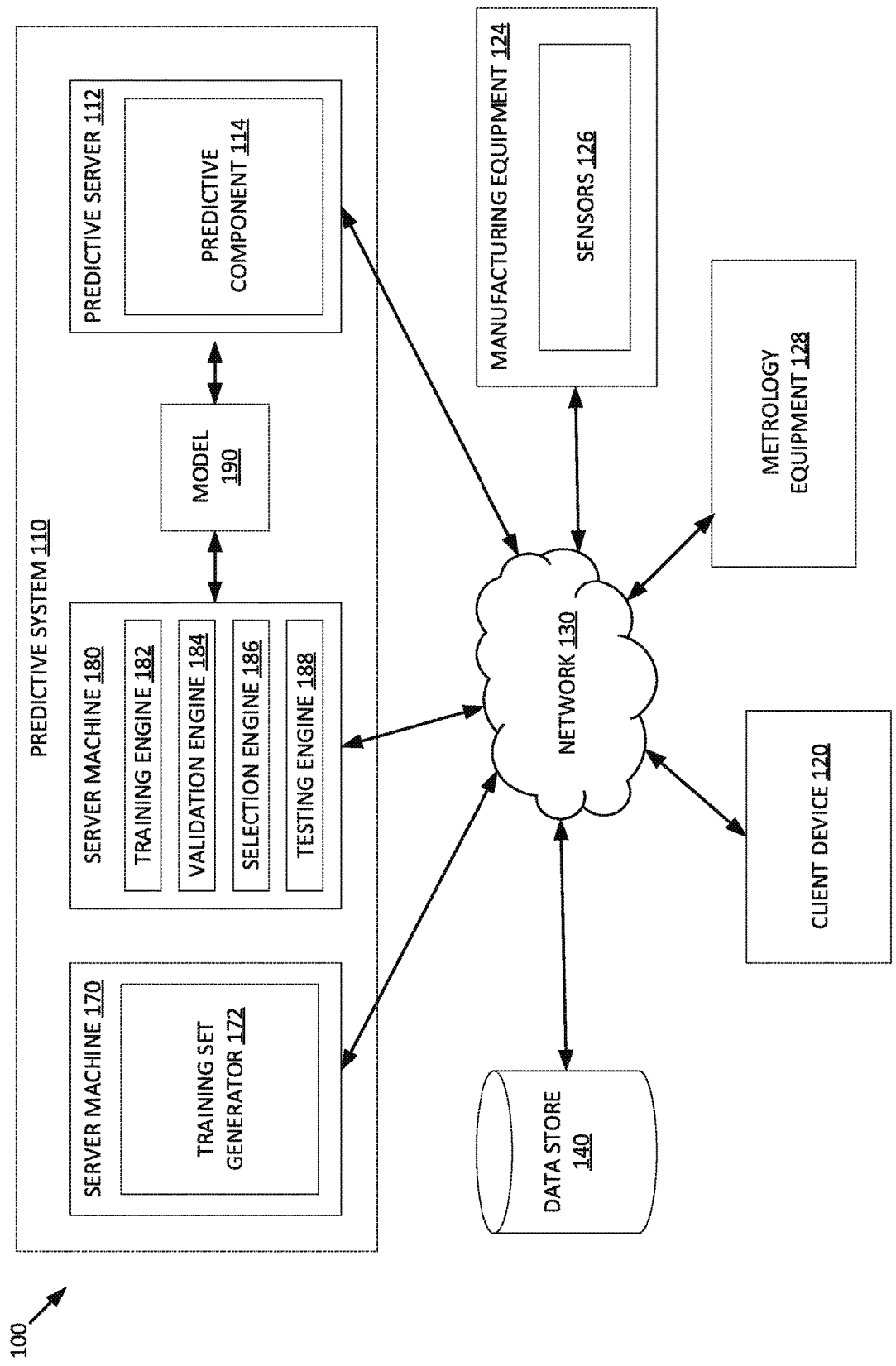
FIG. 1 depicts an illustrative computer system architecture, according to aspects of the present disclosure.

Implementations described herein provide systems and methods for detecting outliers at a manufacturing system using machine learning. A substrate can be processed at a manufacturing system according to a substrate process recipe (i.e., a series of operations performed for the substrate at the manufacturing system) to achieve a target substrate quality and consistency. In some instances, a metrology measurement obtained for the substrate after the substrate process can be used to determine whether the substrate satisfies the target quality and consistency. A metrology measurement can include an etch rate uniformity, a critical dimension for a structure of the substrate, and so forth. To obtain the metrology measurement, a user of the manufacturing system (e.g., an operator, an engineer, etc.) removes the substrate from the manufacturing system and measures the substrate using metrology equipment that is external to the manufacturing system. The external metrology equipment generates a measurement for the substrate and transmits the generated measurement to a processing device for the manufacturing system (e.g., a system controller). The controller can determine whether the metrology measurement satisfies a target measurement value, which indicates whether the substrate achieves the target quality and/or consistency. As generating the metrology measurement using external metrology equipment can take a significant amount of time, the controller can only obtain and evaluate metrology measurements for certain substrates rather than for every substrate processed at the manufacturing system (e.g., in order to satisfy performance conditions).

As can be seen above, a manufacturing system controller can obtain metrology measurements for a limited number of substrates at the manufacturing system to determine whether the substrates satisfy the target quality and consistency. In some instances, the controller can monitor the quality and consistency of other substrates based on data collected by manufacturing system sensors during the substrate process. For example, the controller can determine that a first substrate satisfies a target quality and consistency based on a metrology measurement obtained using the external metrology equipment. Rather than obtaining a metrology measurement for additional substrates processed at the manufacturing system, the controller can compare data collected by manufacturing sensors for the additional substrates to data collected by the manufacturing sensors for the first substrate (referred to as target sensor data). The controller can determine whether the additional substrates satisfy the target quality and/or consistency based on the comparison. Manufacturing systems can include hundreds or thousands of sensors that, in some instances, collect multiple data sets for each process. As a result, thousands or tens of thousands of data sets can be collected for each substrate. Additionally, the controller may not determine whether a substrate satisfies the target quality and/or consistency based on data from a single sensor and instead may consider data from multiple sensors during each substrate process. The controller can parse through the thousands or tens of thousands of data sets to identify the relevant data for the substrate process and perform a significant number of operations for the identified data to determine whether the sensor data collected for the substrate corresponds to target sensor data. Parsing through the significant number of data sets and performing the significant number of operations can consume a large number of manufacturing system resources, which increase overall system latency and decreases overall system efficiency.

Sensors of the manufacturing system can become defective and, as a result, can generate inaccurate data for the substrate during the substrate process. The controller can incorrectly determine that a substrate does not satisfy the target quality and/or consistency based on the inaccurate sensor data and can transmit an error notification to the user, causing the user to remove the substrate from the system. In some instances, the controller and/or the user may not detect that a sensor of the manufacturing system is defective until a significant amount of time after an initial substrate is incorrectly determined to be defective. During this time period, a significant number of substrates can be removed from the manufacturing system and, in some instances, destroyed, even though the removed substrates are not defective.

Aspects of the present disclosure address the above noted deficiencies by providing systems and methods for detecting outliers at a manufacturing system using machine learning. A processing device of a manufacturing system (e.g., a system controller) can provide, as input to a trained machine learning model, data collected by sensors of a manufacturing system during a current process performed for a first set of substrates at the manufacturing system. The machine learning model can be trained to predict a first amount of drift of a first set of parameter values for the first set of substrates from a target set of parameter values for the first set of substrates. The first set of parameter values and the target set of parameter values can include parameter values generated based on data collected by the sensors of the manufacturing system. For example, the first set of parameter values can include parameter values generated based on data collected by the sensors during the current substrate process. The target set of parameter values can include parameter values generated based on data collected during a prior substrate process for a substrate that was previously determined to satisfy a target quality and/or consistency (referred to as the target substrate). In some embodiments, the target substrate is determined to satisfy the target quality and/or consistency based on prior metrology measurement values generated for the target substrate. Accordingly, the first amount of drift for the first set of parameter values from the target set of parameter values can correspond to a difference between an estimated metrology measurement value for each of the first set of substrates and a prior measurement value measured for the target substrate.

The machine learning model can also be trained to predict a second amount of drift from the first set of parameter values for the first set of substrates from a second set of parameter values for a second set of substrates. As mentioned above, the first set of parameter values can include parameter values generated based on data collected by the sensors for the first set of substrates during the current substrate process. The second set of parameter values can include parameter values generated based on data collected by the sensors for a second set of substrates processed according to the current substrate process prior to performance of the current substrate process for the first set of substrates. The second amount of drift for the first set of parameter values from the second set of parameter values can correspond to a difference between sensor data collected for the first set of substrates and sensor data collected for the second set of substrates.

The processing device of the manufacturing system can obtain one or more outputs from the trained machine learning model and can extract the first amount of drift and the second amount of drift from the obtained outputs. In some embodiments, the processing device can determine a substrate health rating based on the first amount of drift. In other or similar embodiments, the processing device can determine a sensor health rating for each sensor at the manufacturing system based on the second amount of drift. The processing device can transmit an indication of the substrate health rating and/or the sensor health rating for each sensor to a client device connected to the manufacturing system. In some embodiments, the processing device can also transmit an indication of whether the a substrate of the first set of substrates and/or a sensor at the manufacturing system is defective.

Aspects of the present disclosure address deficiencies of the conventional technology by providing systems and methods for detecting substrate outliers and sensor outliers at the manufacturing system. The machine learning model can be trained to predict both (i) a first amount of drift of parameter values for a first set of substrates processed according to a current process from parameter values for a target set of substrates, and (ii) a second amount of drift of parameters values for the first set of substrates and a second set of substrates processed according to the current process. The processing device can determine a substrate health rating based on the first amount of drift and determine whether the substrate satisfies the target quality and/or consistency for the current process based on the substrate health rating. The processing device can also determine sensor health ratings based on the second amount of drift and determine whether any sensors of the manufacturing system are defective and need maintained or replaced.

By determining the substrate health rating for each substrate processed at the manufacturing system, the processing device can accurately identify outlier substrates that are produced at the manufacturing system without additional metrology measurements obtained at external metrology equipment. By accurately identifying outlier substrates, the number of falsely identified outlier substrates is significantly reduced, which decreases overall system latency and increases overall system efficiency. Additionally, the number of unidentified outlier substrates is significantly reduced, which reduces the amount of system resources used to process defective substrates and prevents potential damage to other substrates and/or manufacturing system equipment. Further, the processing device can detect, based on the substrate health rating for a series of substrates processed at the manufacturing system, that substrates are drifting away from the target quality and/or consistency for the process recipe and, in response to the detection, transmit a notification to the client device connected to the manufacturing system to alert a user of the drift. The user can take action to remedy the drift away from the target quality and/or consistency, which reduces the overall number of defective substrates processed at the manufacturing system.

By determining the sensor health rating for each sensor of the manufacturing system, the processing device can accurately identify defective sensors that may contribute to the production of outlier substrates at the manufacturing system. For example, the processing device can identify defective sensors that are preventing other equipment at the manufacturing system from operating effectively. In another example, the processing device can identify defective sensors that are generating inaccurate data for a substrate, which causes the substrate to be incorrectly labeled as an outlier substrate. By accurately identifying defective sensors at the manufacturing system, the processing device can transmit a notification to the client device prompting the user of the manufacturing system to take action with respect to the defective sensors. The user of the manufacturing system can be alerted to defective sensors more quickly, which reduces the number of substrates inaccurately identified as outlier substrates at the manufacturing system. The reduction in the inaccurately identified outlier substrates causes an increase in overall system efficiency and a decrease in overall system latency.

Figure 3:
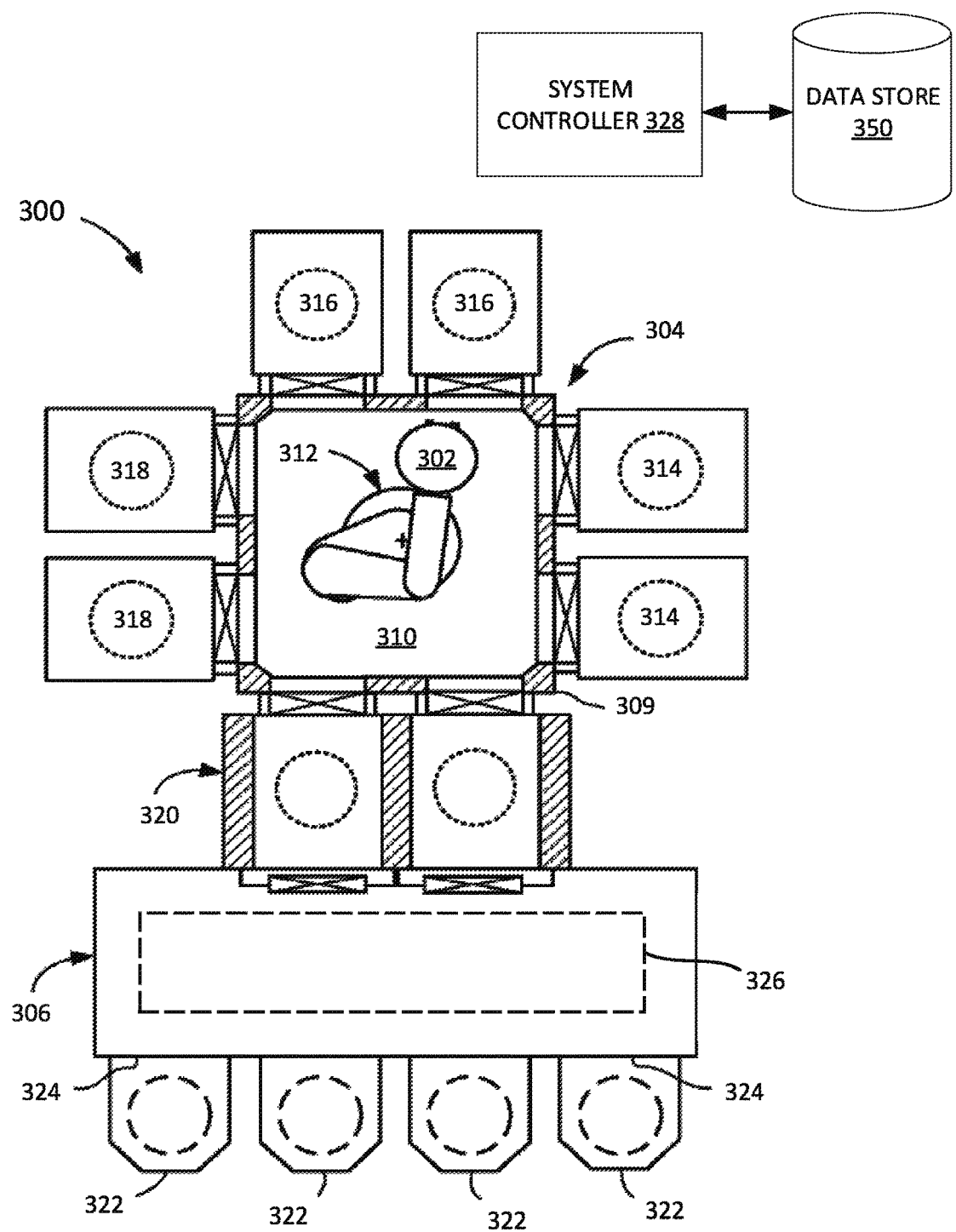
FIG. 3 is a top schematic view of an example manufacturing system, according to aspects of the present disclosure.

FIG. 1 depicts an illustrative computer system architecture 100, according to aspects of the present disclosure. In some embodiments, computer system architecture 100 may be included as part of a manufacturing system for processing substrates, such as manufacturing system 300 of FIG. 3. Computer system architecture 100 includes a client device 120, manufacturing equipment 124, metrology equipment 128, a predictive server 112 (e.g., to generate predictive data, to provide model adaptation, to use a knowledge base, etc.), and a data store 140. The predictive server 112 can be part of a predictive system 110. The predictive system 110 can further include server machines 170 and 180. The manufacturing equipment 124 can include sensors 125 configured to capture data for a substrate being processed at the manufacturing system. In some embodiments, the manufacturing equipment 124 and sensors 126 can be part of a sensor system that includes a sensor server (e.g., field service server (FSS) at a manufacturing facility) and sensor identifier reader (e.g., front opening unified pod (FOUP) radio frequency identification (RFID) reader for sensor system). In some embodiments, metrology equipment 128 can be part of a metrology system that includes a metrology server (e.g., a metrology database, metrology folders, etc.) and metrology identifier reader (e.g., FOUP RFID reader for metrology system).

Manufacturing equipment 124 produces products following a recipe or performing runs over a period of time. Manufacturing equipment 124 can include one or more sensors 126 configured to generate data for a substrate during a substrate process (referred to as sensor data). Sensor data may include a value of one or more of temperature (e.g., heater temperature), spacing (SP), pressure, high frequency radio frequency (HFRF), voltage of electrostatic chuck (ESC), electrical current, flow, power, voltage, etc. Sensor data may be associated with or indicative of manufacturing parameters such as hardware parameters, such as settings or components (e.g., size, type, etc.) of the manufacturing equipment 124, or process parameters of the manufacturing equipment 124. The sensor data can be provided while the manufacturing equipment 124 is performing manufacturing processes (e.g., equipment readings when processing products). The sensor data 142 can be different for each substrate.

Metrology equipment 128 provides metrology data associated with substrates (e.g., wafers, etc.) processed by manufacturing equipment 124. The metrology data can include a value of one or more of film property data (e.g., wafer spatial film properties), dimensions (e.g., thickness, height, etc.), dielectric constant, dopant concentration, density, defects, etc. In some embodiments, the metrology data can further include a value of one or more surface profile property data (e.g., an etch rate, an etch rate uniformity, a critical dimension of one or more features included on a surface of the substrate, a critical dimension uniformity across the surface of the substrate, an edge placement error, etc.). The metrology data can be of a finished or semi-finished product. The metrology data can be different for each substrate.

The client device 120 includes a computing device such as personal computers (PCs), laptops, mobile phones, smart phones, tablet computers, netbook computers, network connected televisions ("smart TVs"), network-connected media players (e.g., Blu-ray player), a set-top box, over-the-top (OTT) streaming devices, operator boxes, etc. In some embodiments, the metrology data may be received from the client device 120. In some embodiments, client device 120 displays a graphical user interface (GUI), where the GUI enables the user to provide, as input, metrology measurement values for substrates processed at the manufacturing system. In other or similar embodiments, client device 120 can display another GUI that enables user to provide, as input, an indication of a type of substrate to be processed at the manufacturing system, a type of process to be performed for the substrate, and/or a type of equipment at the manufacturing system.

Data store 140 can be a memory (e.g., random access memory), a drive (e.g., a hard drive, a flash drive), a database system, or another type of component or device capable of storing data. Data store 140 can include multiple storage components (e.g., multiple drives or multiple databases) that may span multiple computing devices (e.g., multiple server computers). The data store 140 can store data associated with processing a substrate at manufacturing equipment 124. For example, data store 140 can store data collected by sensors 126 at manufacturing equipment 124 before, during, or after a substrate process (referred to as process data). Process data can refer to historical process data (e.g., process data generated for a previous substrate processed at the manufacturing system) and/or current process data (e.g., process data generated for a current substrate processed at the manufacturing system). Current process data can be data for which predictive data is generated. In some embodiments, data store can store metrology data including historical metrology data (e.g., metrology measurement values for a prior substrate processed at the manufacturing system).

In some embodiments, process data can also refer to data associated with a difference between data collected for different sets of substrates processed at manufacturing equipment 124. For example, process data can refer to an indication of a difference between sensor data collected for a set of substrates and sensor data collected for a target set of substrates (i.e., a set of substrates previously determined to correspond to a target quality and/or consistency). In another example, process data can refer to an indication of a difference between metrology data for a set of substrates and metrology data for a target set of substrates.

The data store 140 can also store contextual data associated with one or more substrates processed at the manufacturing system. Contextual data can include a recipe name, recipe operation number, preventive maintenance indicator, operator, etc. In some embodiments, contextual data can also include an indication of a difference between two or more process recipes or process operations.

In some embodiments, data store 140 can be configured to store data that is not accessible to a user of the manufacturing system. For example, process data, spectral data, non-spectral data, and/or positional data obtained for a substrate being processed at the manufacturing system may not be accessible to a user of the manufacturing system. In some embodiments, all data stored at data store 140 is inaccessible by a user (e.g., an operator) of the manufacturing system. In other or similar embodiments, a portion of data stored at data store 140 is inaccessible by the user while another portion of data stored at data store 140 is accessible by the user. In some embodiments, one or more portions of data stored at data store 140 are encrypted using an encryption mechanism that is unknown to the user (e.g., data is encrypted using a private encryption key). In other or similar embodiments, data store 140 includes multiple data stores where data that is inaccessible to the user is stored in one or more first data stores and data that is accessible to the user is stored in one or more second data stores.

In some embodiments, predictive system 110 includes server machine 170 and server machine 180. Server machine 170 includes a training set generator 172 that is capable of generating training data sets (e.g., a set of data inputs and a set of target outputs) to train, validate, and/or test a machine learning model 190. Some operations of data set generator 172 are described in detail below with respect to FIG. 6. In some embodiments, the data set generator 172 can partition the training data into a training set, a validating set, and a testing set. In some embodiments, the predictive system 110 generates multiple sets of training data.

Server machine 180 includes a training engine 182, a validation engine 184, a selection engine 186, and/or a testing engine 188. An engine can refer to hardware (e.g., circuitry, dedicated logic, programmable logic, microcode, processing device, etc.), software (such as instructions run on a processing device, a general purpose computer system, or a dedicated machine), firmware, microcode, or a combination thereof. Training engine 182 can be capable of training a machine learning model 190. The machine learning model 190 can refer to the model artifact that is created by the training engine 182 using the training data that includes training inputs and corresponding target outputs (correct answers for respective training inputs). The training engine 182 can find patterns in the training data that map the training input to the target output (the answer to be predicted), and provide the machine learning model 190 that captures these patterns. In some embodiments, the machine learning model 190 uses one or more of support vector machine (SVM), Radial Basis Function (RBF), clustering, supervised machine learning, semi-supervised machine learning, unsupervised machine learning, k-nearest neighbor algorithm (k-NN), linear regression, random forest, neural network (e.g., artificial neural network), etc.

The validation engine 184 can be capable of validating a trained machine learning model 190 using a corresponding set of features of a validation set from training set generator 172. The validation engine 184 can determine an accuracy of each of the trained machine learning models 190 based on the corresponding sets of features of the validation set. The validation engine 184 can discard a trained machine learning model 190 that has an accuracy that does not meet a threshold accuracy. In some embodiments, the selection engine 185 can be capable of selecting a trained machine learning model 190 that has an accuracy that meets a threshold accuracy. In some embodiments, the selection engine 185 can be capable of selecting the trained machine learning model 190 that has the highest accuracy of the trained machine learning models 190.

The testing engine 186 can be capable of testing a trained machine learning model 190 using a corresponding set of features of a testing set from data set generator 172. For example, a first trained machine learning model 190 that was trained using a first set of features of the training set can be tested using the first set of features of the testing set. The testing engine 186 can determine a trained machine learning model 190 that has the highest accuracy of all of the trained machine learning models based on the testing sets.

Predictive server 112 includes a predictive component 114 that is capable of providing data collected by one or more sensors at a manufacturing system during a current process performed for a first set of substrates as input to trained machine learning model 190 and running trained machine learning model 190 on the input to obtain one or more outputs. As described in detail below with respect to FIG. 2, in some embodiments, predictive component 114 is also capable of extracting drift data from the output of the trained machine learning model and using the drift data to determine a substrate health rating for each of the first set of substrates and a sensor health rating for each of the sensors of the manufacturing system.

The drift data can include an indication of a first amount of drift of a first set of parameter values for the first set of substrates from a target set of parameter values for the first set of substrates. The drift data can also include an indication of a second amount of drift of the first set of parameter values from a second set of parameter values for a second set of substrates processed according to the current process at the manufacturing system prior to the performance of the current process for the first set of substrates. Predictive system 110 can determine a substrate health rating for each of the first set of substrates based on the first amount of drift and a sensor health rating for each of the sensors based on the second amount of drift. In some embodiments, predictive system 110 can transmit a notification to a user of the manufacturing system 100 (e.g., an operator) indicating the determined substrate health rating and/or sensor health ratings.

The client device 120, manufacturing equipment 124, sensors 126, metrology equipment 128, predictive server 112, data store 140, server machine 170, and server machine 180 can be coupled to each other via a network 130. In some embodiments, network 130 is a public network that provides client device 120 with access to predictive server 112, data store 140, and other publicly available computing devices. In some embodiments, network 130 is a private network that provides client device 120 access to manufacturing equipment 124, metrology equipment 128, data store 140, and other privately available computing devices. Network 130 can include one or more wide area networks (WANs), local area networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

It should be noted that in some other implementations, the functions of server machines 170 and 180, as well as predictive server 112, may be provided by a fewer number of machines. For example, in some embodiments, server machines 170 and 180 may be integrated into a single machine, while in some other or similar embodiments, server machines 170 and 180, as well as predictive server 112, may be integrated into a single machine.

In general, functions described in one implementation as being performed by server machine 170, server machine 180, and/or predictive server 112 can also be performed on client device 120. In addition, the functionality attributed to a particular component can be performed by different or multiple components operating together.

In embodiments, a "user" can be represented as a single individual. However, other embodiments of the disclosure encompass a "user" being an entity controlled by a plurality of users and/or an automated source. For example, a set of individual users federated as a group of administrators may be considered a "user."

Figure 2:
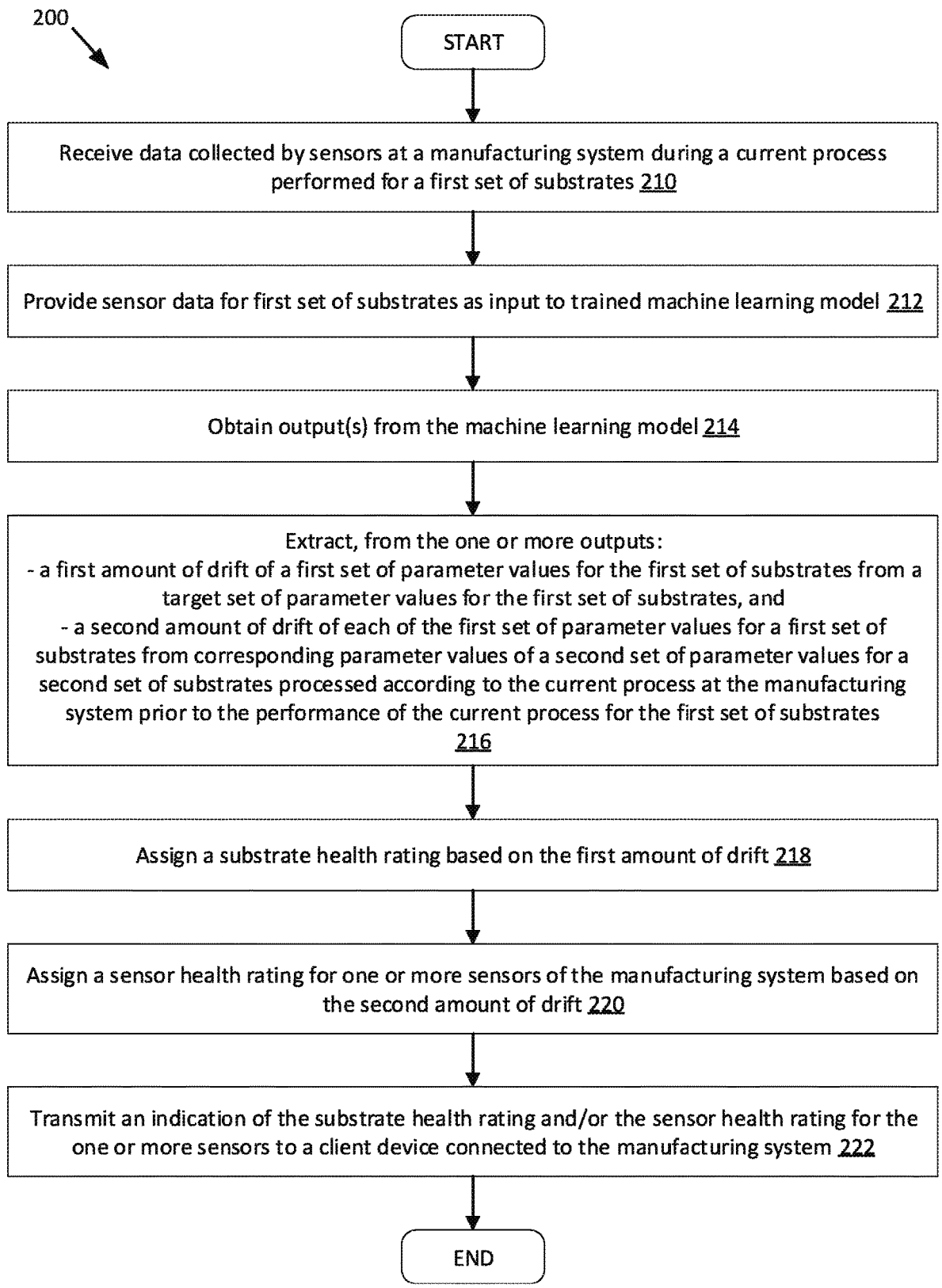
FIG. 2 is a flow chart of a method for detecting outliers at a manufacturing system using machine learning, according to aspects of the present disclosure.

FIG. 2 is a flow chart of a method 200 for detecting outliers at a manufacturing system using machine learning, according to aspects of the present disclosure. Method 200 is performed by processing logic that can include hardware (circuitry, dedicated logic, etc.), software (such as is run on a general purpose computer system or a dedicated machine), firmware, or some combination thereof. In one implementation, method 200 can be performed by a computer system, such as computer system architecture 100 of FIG. 1. In other or similar implementations, one or more operations of method 200 can be performed by one or more other machines not depicted in the figures. In some aspects, one or more operations of method 200 can be performed by predictive component 114 of predictive server 112.

For simplicity of explanation, the methods are depicted and described as a series of acts. However, acts in accordance with this disclosure can occur in various orders and/or concurrently, and with other acts not presented and described herein. Furthermore, not all illustrated acts can be performed to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term article of manufacture, as used herein, is intended to encompass a computer program accessible from any computer-readable device or storage media.

At block 210, processing logic can receive data collected by sensors at a manufacturing system during a current process performed for a first set of substrates. In some embodiments, manufacturing system can correspond to manufacturing system 300 of FIG. 3. Manufacturing system 300 may perform one or more processes on a substrate 302. Substrate 302 may be any suitably rigid, fixed-dimension, planar article, such as, e.g., a silicon-containing disc or wafer, a patterned wafer, a glass plate, or the like, suitable for fabricating electronic devices or circuit components thereon.

Manufacturing system 300 may include a process tool 304 and a factory interface 306 coupled to process tool 304. Process tool 304 can include a housing 308 having a transfer chamber 310 therein. Transfer chamber 310 can include one or more processing chambers (also referred to as process chambers) 314, 316, 318 disposed therearound and coupled thereto. Processing chambers 314, 316, 318 can be coupled to transfer chamber 310 through respective ports, such as slit valves or the like. Transfer chamber 310 can also include a transfer chamber robot 312 configured to transfer substrate 302 between process chambers 314, 316, 318, load lock 320, etc. Transfer chamber robot 312 can include one or multiple arms where each arm includes one or more end effectors at the end of each arm. The end effector may be configured to handle particular objects, such as wafers.

Processing chambers 314, 316, 318 can be adapted to carry out any number of processes on substrates 302. A same or different substrate process can take place in each processing chamber 314, 316, 318. A substrate process can include atomic layer deposition (ALD), physical vapor deposition (PVD), chemical vapor deposition (CVD), etching, annealing, curing, pre-cleaning, metal or metal oxide removal, or the like. Other processes can be carried out on substrates therein. Processing chambers 314, 316, 318 can each include one or more sensors configured to capture data for substrate 302 before, after, or during a substrate process. For example, the sensors can be configured to capture spectral data and/or non-spectral data for a portion of substrate 302 during a substrate process. In other or similar embodiments, the sensors can be configured to capture data associated with the environment within processing chamber 314, 316, 318 before, after, or during the substrate process. For example, the sensors may be configured to capture data associated with a temperature, a pressure, a gas concentration, etc. of the environment within processing chamber 314, 316, 318 during the substrate process.

A load lock 320 can also be coupled to housing 308 and transfer chamber 310. Load lock 320 can be configured to interface with, and be coupled to, transfer chamber 310 on one side and factory interface 306. Load lock 320 can have an environmentally-controlled atmosphere that can be changed from a vacuum environment (wherein substrates may be transferred to and from transfer chamber 310) to an at or near atmospheric-pressure inert-gas environment (wherein substrates can be transferred to and from factory interface 306), in some embodiments. Load lock 320 can include one or more sensors configured to capture data associated with substrate 302 before, after, or during a substrate process at processing chambers 314, 316, 318. For example, load lock 320 can include a vibration sensor (e.g., a piezoelectric sensor) configured to detect and monitor an amount of vibration occurring within load lock 320 during a substrate process at processing chambers 314, 316, 318. In another example, load lock 320 can include a temperature sensor (e.g., an infrared camera) to detect and monitor a temperature of load lock 320 during a substrate process. It should be noted that, although embodiments of the present disclosure describe sensors such as a vibration sensor or a temperature sensor at load lock 320 to monitor a state of load lock 320 during a substrate process, any type of sensor can be used at any station of manufacturing system 100 to monitor the state and/or health of the station during a substrate process.

Factory interface 306 may be any suitable enclosure, such as, e.g., an Equipment Front End Module (EFEM). Factory interface 306 may be configured to receive substrates 302 from substrate carriers 322 (e.g., Front Opening Unified Pods (FOUPs)) docked at various load ports 324 of factory interface 306. A factory interface robot 326 (shown dotted) can be configured to transfer substrates 302 between carriers (also referred to as containers) 322 and load lock 320. Carriers 322 can include a substrate storage carrier and/or a replacement part storage carrier. Factory interface 306 and/or carriers 322 may include sensors (e.g., a vibration sensor, a temperature sensor, etc.) to capture data associated with substrate 302 before, after, or during a substrate process at processing chambers 314, 316, 318, as previously described.

Manufacturing system 300 can also include a system controller 328. System controller 328 can be and/or include a computing device such as a personal computer, a server computer, a programmable logic controller (PLC), a microcontroller, and so on. System controller 328 may include one or more processing devices, which may be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. System controller 328 may include a data storage device (e.g., one or more disk drives and/or solid state drives), a main memory, a static memory, a network interface, and/or other components. System controller 328 can execute instructions to perform any one or more of the methodologies and/or embodiments described herein. In some embodiments, system controller 328 may execute instructions to perform one or more operations at manufacturing system 300 in accordance with a process recipe. The instructions can be stored on a computer readable storage medium, which may include the main memory, static memory, secondary storage and/or processing device (during execution of the instructions).

System controller 328 can receive data from sensors included on or within various portions of manufacturing system 300 (e.g., processing chambers 314, 316, 318, transfer chamber 310, load lock 320, etc.). In some embodiments, data received by the system controller 328 can include data for a portion of substrate 302. For purposes of the present description, system controller 328 may be described as receiving data from sensors included within processing chambers 314, 316, 318. However, system controller 328 can receive data from any portion of manufacturing system 300 and can use data received from the portion in accordance with embodiments described herein. In an illustrative example, system controller 328 can receive data from a sensor of processing chamber 314, 316, 318 before, after, or during a substrate process. Data received from sensors of the various portions of manufacturing system 300 may be stored in a data store 350. Data store 350 can be included as a component within system controller 328 or can be a separate component from system controller 328. In some embodiments, data store 350 may be data store 140 described with respect to FIG. 1.

Referring back to FIG. 2, at block 212, processing logic provides sensor data for the first set of substrates as input to a trained machine learning model. In some embodiments, processing logic also provides an indication of a process type for the current process (e.g., an etch process, a plasma vapor deposition process, etc.) performed for the first set of substrates, a substrate type for each of the first set of substrates, and/or an equipment type for one or more equipment at the manufacturing system. The indication of the process type, the substrate type and/or the equipment type can be determined by processing logic based on contextual data associated with the current process or can be provided by a user of the manufacturing system (e.g., via client device 120). At block 214, processing logic obtains one or more outputs from the trained machine learning model. In some embodiments, the one or more outputs include data corresponding to a prior process performed for a prior set of substrates at the manufacturing system (referred to as prior data). The prior data can include prior sensor data collected by the sensors of the manufacturing system during the prior process and prior metrology data for the prior set of substrates. The one or more outputs can further include a level of confidence that the first set of substrates being processed according to the current process is associated with the prior metrology data for the prior set of substrates. In other or similar embodiments, the one or more outputs can include data corresponding to the current process performed for a second set of substrates processed at the manufacturing system prior to the current process being performed for the first set of substrates. The data can include sensor data collected during the current process for the second set of substrates.

At block 216, processing logic can extract a first amount of drift of a first set of parameter values for the first set of substrates from a target set of parameter values for the first set of substrates. The first amount of drift corresponds to a first aggregation metric for a first set of distance values for the sensors at the manufacturing system. Each of the first set of distance values indicates a distance between data collected by a respective sensors during the current process performed for the first set of substrates and prior data collected by the respective sensor during a prior process preformed for a prior set of substrates. In some embodiments, the prior set of substrates can be a target set of substrates (i.e., a set of substrates determined to satisfy a target quality and/or consistency).

The first aggregation metric can correspond to a LP-norm transformation aggregation metric, a statistical moment aggregation metric (e.g., an average metric, a standard deviation metric, etc.), a distribution aggregation metric (e.g., a t-test metric, a f-test metric, a Wasserstein distance metric, etc.), a divergence aggregation metric (e.g., a KL distance metric), a kernel distance aggregation metric, a co-expression measure aggregation metric (e.g., a correlation metric, a mutual information metric, etc.), or a loss function aggregation metric (e.g., a root mean square deviation metric, a cross entropy metric, etc.). In some embodiments, the first aggregation metric corresponds to a LP-norm transformation aggregation metric. The first set of distance values can each correspond to at least one of a z-score distance value, a multi-dimension based distance value (e.g., Mahalanobis Distance value, etc.), a distribution test based distance value (e.g., a t-test distance value, a f-test distance value, etc.), a likelihood distance value (e.g., a Frequency Histogram based likelihood distance value, etc.), a Gaussian mixture model distance value, or a clustering based centroid distance value (e.g., a k-means distance value, etc.). In some embodiments, the first set of distance values can each correspond to a z-score distance value.

As described above with respect to block 212, in some embodiments, processing logic can provide an indication of a process type for the current process, a substrate type for each of the first set of substrates, and/or an equipment type for one or more equipment at the manufacturing system. In such embodiments, the target set of parameter values can be parameter values that correspond to sensor data collected during a prior process associated with the process type, the substrate type, or the equipment type. For example, the target set of parameter values can be parameter values corresponding to sensor data collected during a prior process having the same type as the type of the provided indication.

At block 216, processing logic can extract a second amount of drift of the first set of parameter values for the first set of substrates from a second set of parameter values for the second set of substrates processed according to the current process at the manufacturing system prior to the performance of the current process for the first set of substrates. The second amount of drift corresponds to a second aggregation metric for a second set of distance values for the first set of substrates. Each of the second set of distance values indicates a distance between one or more first parameter values for a respective substrate of the first set of substrates and one or more second parameter values for an additional respective substrate of the second set of substrates.

In some embodiments, the one or more first parameter values and the one or more second parameter values can be determined based on data collected by a single sensor in the manufacturing system. In other or similar embodiments, the one or more first parameter values and the one or more second parameter values can be determined based on data collected by multiple sensors in the manufacturing system. For example, the first parameter values and the second parameter values can be determined based on data collected by a temperature detection sub-system of a process chamber. The temperature detection sub-system can include multiple temperature sensors placed at various portions of a process chamber.

The second aggregation metric can correspond to a LP-norm transformation aggregation metric, a statistical moment aggregation metric, a distribution aggregation metric, a divergence aggregation metric, a kernel distance aggregation metric, a co-expression measure aggregation metric, or a loss function aggregation metric. In some embodiments, the second aggregation metric corresponds to a LP-norm transformation aggregation metric. The second set of distance values can each correspond to at least one of a z-score distance value, a multi-dimension based distance value, a distribution test based distance value, a likelihood distance value, a Gaussian mixture model distance value, or a clustering based centroid distance value. In some embodiments, the second set of distance values can each correspond to a z-score distance value.

At block 218, processing logic can assign a substrate health rating to each of the first set of substrates based on the first amount of drift. In some embodiments, processing logic can assign a substrate health rating by determining whether the first amount of drift satisfies a first drift criterion. In some embodiments, the first amount of drift can satisfy the first drift criterion by falling below a threshold amount of drift. In response to determining that the first amount of drift satisfies the first drift criterion, processing logic can assign a first substrate health rating to each of the first set of substrates. A respective substrate assigned to the first substrate health rating can correspond to a substrate that satisfies at least one of a target quality or a target consistency for the current process. In response to determining that the first amount of drift does not satisfy the first drift criterion (e.g., that the first amount of drift exceeds the threshold amount of drift), processing logic can assign a second substrate health rating to each of the first set of substrates. A respective substrate assigned to the second substrate health rating can correspond to a substrate that does not satisfy the target quality or the target consistency for the current process.

At block 220, processing logic can assign a sensor health rating for one or more sensors of the manufacturing system based on the second amount of drift for each of the first set of parameter values from corresponding parameter values of the second set of parameter values. In some embodiments, each parameter value of the first set of parameter values and corresponding parameter values of the second set of parameter values correspond to a particular sensor (or a particular set of sensors) of the manufacturing system. Processing logic can assign the sensor health rating for each respective sensor by determining whether the second amount of drift of a first parameter value of the first set of parameter values from a second parameter value of the second set of parameter values satisfies a second drift criterion. In some embodiments the second amount of drift of the first parameter value from the second parameter value satisfies the second drift criterion by falling below a threshold value. In response to determining the second amount of drift of the first parameter value from the second parameter value satisfies the second drift criterion, processing logic can assign a first sensor health rating to the respective sensor. A respective sensor associated with the first sensor health rating corresponds to an operative sensor. In response to determining the second amount of drift of the first parameter value from the second parameter value does not satisfy the second drift criterion, processing logic can assign a second sensor health rating to the respective sensor. A respective sensor associated with the second sensor health rating corresponds to a defective sensor.

At block 222, processing logic can transmit an indication of the substrate health rating for each of the first set of substrates and/or the sensor health rating for the one or more sensors to a client device connected to the manufacturing system. In some embodiments, the client device can correspond to client device 120 of FIG. 1. Client device 120 can display a graphical user interface (GUI) indicating the substrate health rating and/or sensor health rating determined in accordance with previously described embodiments. Further details regarding the GUI displayed by client device 120 are provided with respect to FIGS. 4 and 5 below.

Figure 4:
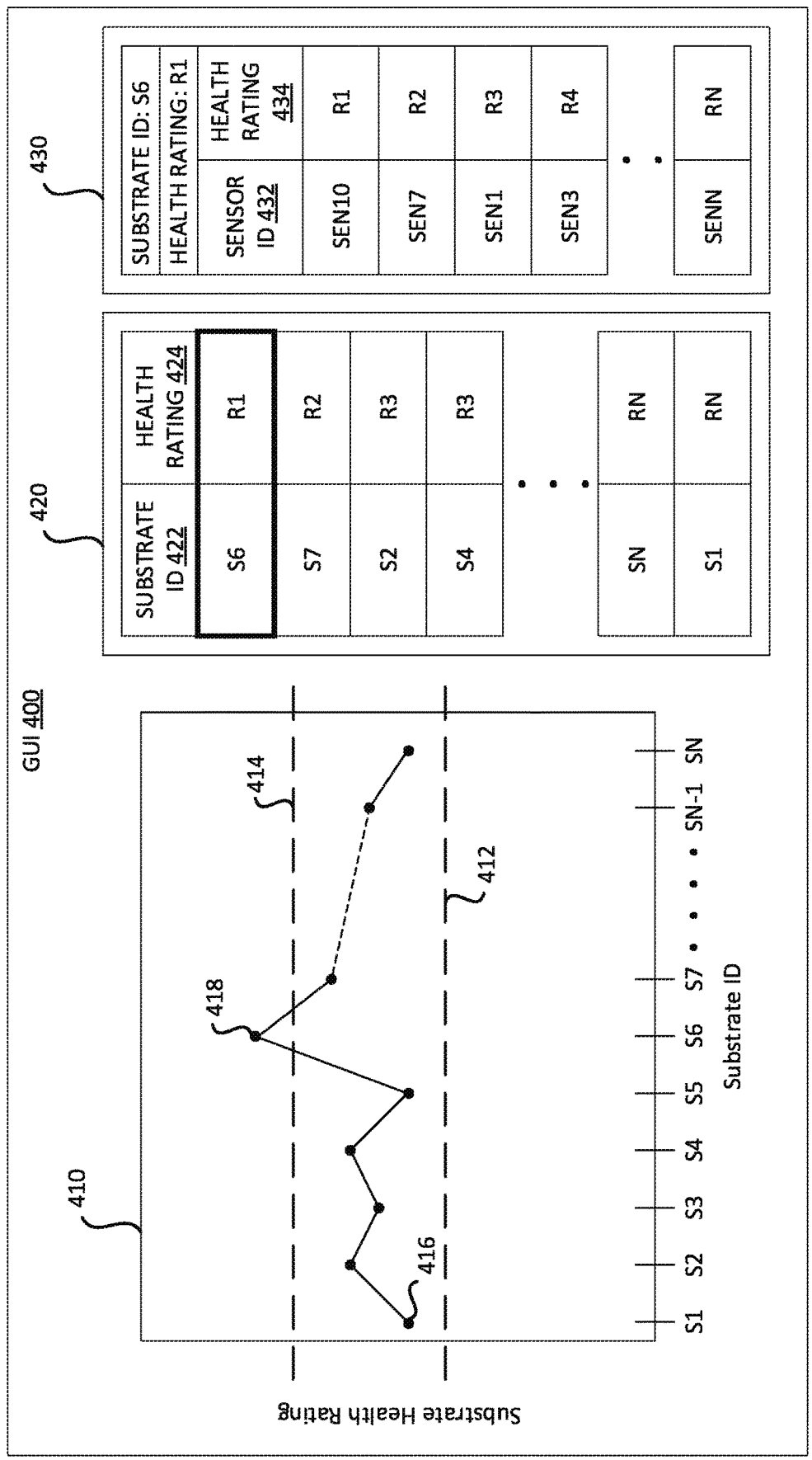
FIG. 4 illustrates an example graphical user interface (GUI) for detecting outliers at a manufacturing system, according to aspects of the present disclosure.

FIG. 4 illustrates an example graphical user interface (GUI) 400 for detecting outliers at a manufacturing system, according to aspects of the present disclosure. In some embodiments, GUI 400 can be configured to display data associated with one or more substrate health ratings determined in accordance with previously described embodiments. A client device (e.g., client device 120) connected to the manufacturing system can display GUI 400 to a user (e.g., an operator, an engineer, etc.) in response to receiving the substrate health ratings.

In some embodiments, GUI 400 can include a first portion 410 configured to provide a graphical representation of the received health ratings for each substrate processed at the manufacturing system. As illustrated, portion 410 can include a graph that provides an indication of a target range of substrate health ratings for each substrate. For example, portion 410 can include an upper substrate health rating boundary 412 an a lower substrate health rating boundary 414. Substrates having a substrate health rating that is between the upper substrate health rating boundary 412 and the lower substrate health rating boundary 414 can be within the target range of substrate health ratings. A substrate having a substrate health rating within the target range is considered to satisfy a target quality and/or consistency for the current process, as previously described. As illustrated in FIG. 4, substrate S1 has a first substrate health rating 416 that is within the target range because first substrate health rating 416 is between the upper substrate health rating boundary 412 and the lower substrate health rating boundary 414. As such, substrate S1 is considered to satisfy the target quality and/or consistency for the current process. Substrate S6 has a second substrate health rating 418 that is outside of the target range because second substrate health rating 418 is greater than the upper substrate health rating boundary 414.

In some embodiments, GUI 400 includes a second portion 420 that is configured to provide a table indicating each health rating for each substrate processed at the manufacturing system. In some embodiments, the table can include entries for each substrate processed at the manufacturing system. Each entry can include a substrate identifier (ID) field 422 and a health rating field 424. In some embodiments, the entries are ordered such that substrates having a substrate health rating outside of the target range are displayed at the top of the table. For example, as illustrated in FIG. 4, the entry for substrate S6 is displayed at the top the table, as substrate S6 is associated with a substrate health rating outside of the target range. The entries for substrates SN and Si are displayed at the bottom of the table, as substrates SN and Si are associated with substrate health ratings within the target range. In some embodiments, the second portion can also include a GUI element that indicates which substrates are associated with substrate health ratings that are outside of the target range (i.e., are considered outlier substrates). As illustrated in FIG. 4, the second portion 420 of GUI 400 includes a GUI element highlighting the entry for substrate S6, as substrate S6 is associated with a substrate health rating that is outside of the target range.

In some embodiments, GUI 400 can include a third portion 430 that is configured to provide sensor health ratings for one or more sensors of the manufacturing system that collected data for a particular substrate. For example, as illustrated in FIG. 4, the third portion 430 provides sensor health ratings for sensors that collected data for substrate S6. The third portion 430 can include a table indicating the health ratings for each sensor that collected data that contributed to the amount of drift of the parameter values measured for a substrate during the current process from a target parameter value. Each entry of the table can correspond to a sensor that contributed to the drift, where each entry includes a sensor ID field 432 and a sensor health rating field 434. In some embodiments, the table of portion 430 can be organized such that the sensor that had the most significant contribution to the drift is provided at the top of the table (e.g., SEN10) and the sensor that had the least significant contribution to the drift is provided at the bottom of the table (e.g., SENN). In other or similar embodiments the table of portion 430 can be organized such that a sensor having the highest sensor health rating is provided at the top of the table and the sensor having the lowest sensor health rating is provide at the bottom of the table. In some embodiments, the table of portion 430 can provide additional data for each sensor. For example, the table of portion 430 can include an entry that includes a graphical representation and/or a list of sensor data collected for the particular substrate.

Figure 5:
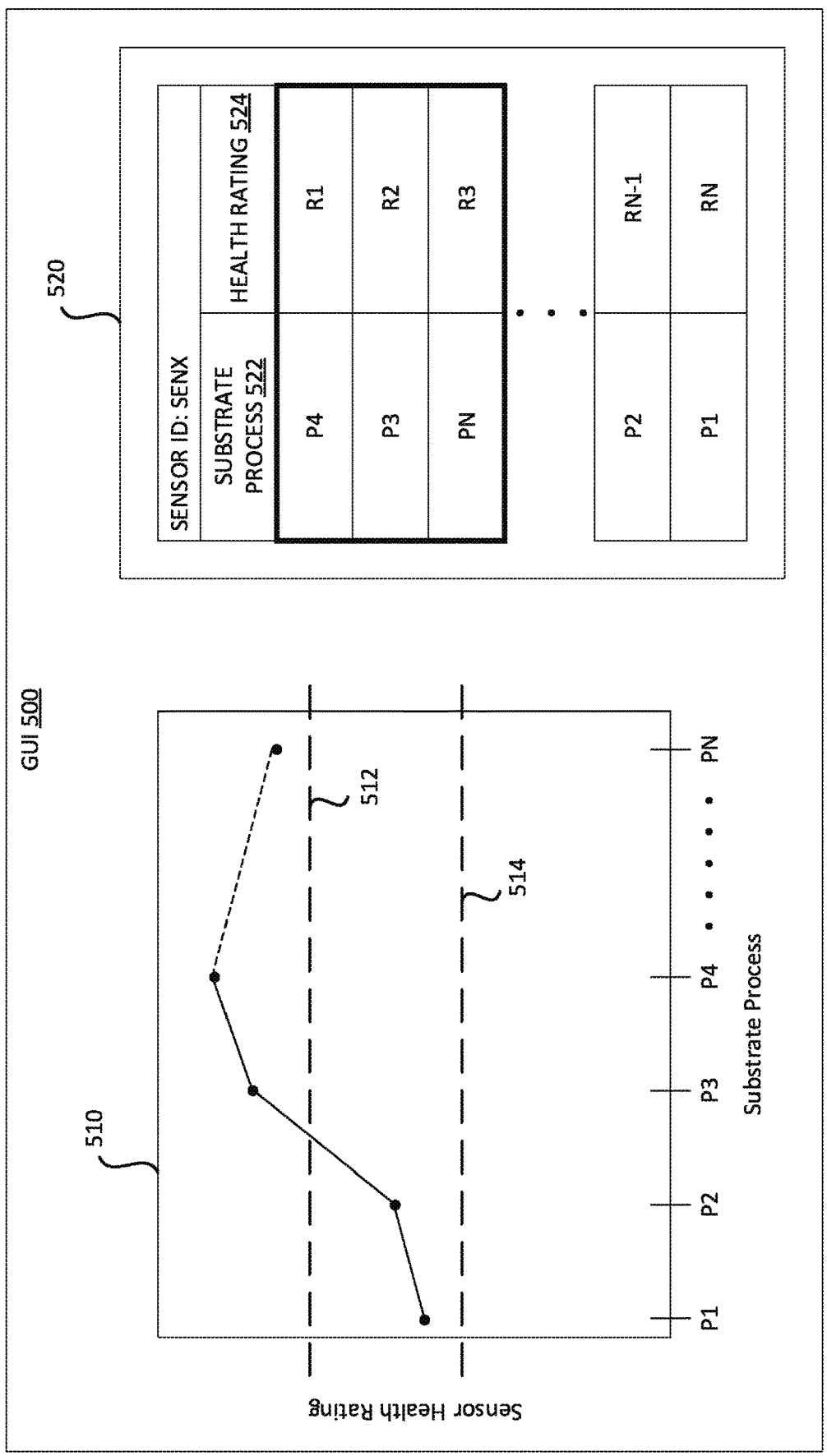
FIG. 5 illustrates another example GUI for detecting outliers at a manufacturing system, according to aspects of the present disclosure.

FIG. 5 illustrates another example GUI 500 for detecting outliers at a manufacturing system, according to aspects of the present disclosure. In some embodiments, GUI 500 can be configured to display data associated with one or more sensor health ratings determined for a particular sensor, in accordance with previously described embodiments. GUI 500 can include a first portion 510 configured to provide a graphical representation of the received health ratings for a sensor during one or more processes (e.g., process P1, process P2, etc.) of the manufacturing system. As illustrated, portion 510 can include a graph that provides an indication of a target range of sensor health ratings for each sensor. For example, portion 510 can include an upper sensor health rating boundary 512 and a lower sensor health rating boundary 514. If the health rating for the sensor is within the target range for a particular process (e.g., process P1 and process P2), the sensor is considered to be operative. If the health rating for the sensor is outside of the target range for a particular process (e.g., process P3, process P4, . . . process PN), the sensor is considered to be defective.

In some embodiments, GUI 500 can also include a second portion 520 that is configured to provide a table indicating the health rating for the sensor during one or more processes performed at the manufacturing system. In some embodiments, the table can include entries for each process. Each entry can include a substrate process identifier (ID) field 522 and a sensor health rating field 524. In some embodiments, the entries can be ordered such that that the substrate processes in which the sensor was assigned a sensor health rating that is outside of the target range are provided at the top of the table (e.g., process P4, process P3, process PN). In some embodiments, the second portion 520 can also include a GUI element that indicates which substrate processes are associated with sensor health ratings that are outside of the target range (i.e., sensor is considered defective). As illustrated in FIG. 5, the second portion 520 of GUI 500 includes a GUI element highlighting the entry for processes P4, P3, and PN, as processes P4, P3, and PN are associated with a sensor health rating that is outside of the target range.

Figure 6:
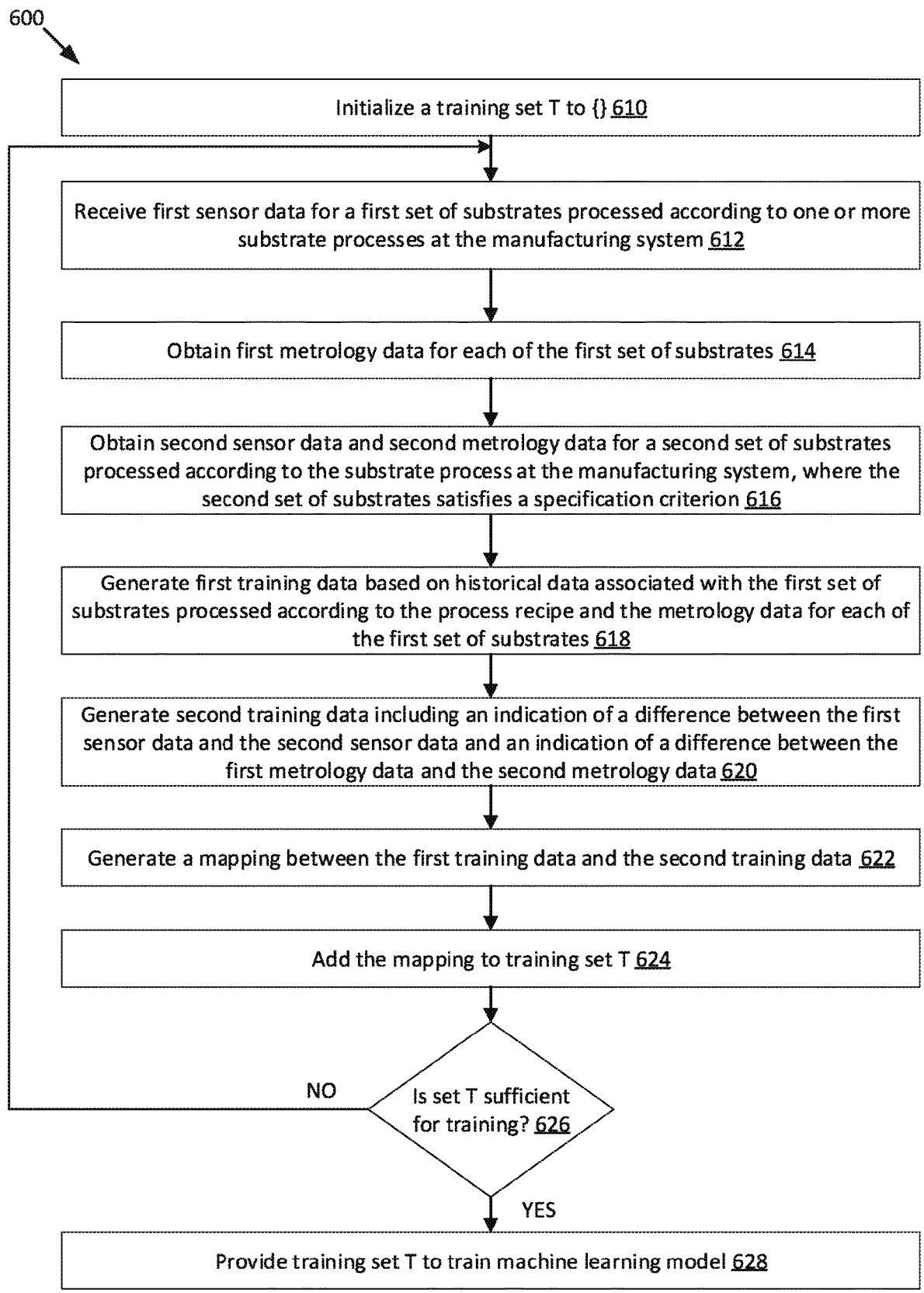
FIG. 6 is a flow chart of a method for training a machine learning model, according to aspects of the present disclosure.

FIG. 6 is a flow chart of a method 600 for training a machine learning model, according to aspects of the present disclosure. Method 600 is performed by processing logic that can include hardware (circuitry, dedicated logic, etc.), software (such as is run on a general purpose computer system or a dedicated machine), firmware, or some combination thereof. In one implementation, method 600 can be performed by a computer system, such as computer system architecture 100 of FIG. 1. In other or similar implementations, one or more operations of method 600 can be performed by one or more other machines not depicted in the figures. In some aspects, one or more operations of method 700 can be performed by training set generator 172 of server machine 170.

For simplicity of explanation, the methods are depicted and described as a series of acts. However, acts in accordance with this disclosure can occur in various orders and/or concurrently, and with other acts not presented and described herein. Furthermore, not all illustrated acts can be performed to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term article of manufacture, as used herein, is intended to encompass a computer program accessible from any computer-readable device or storage media.

At block 610, processing logic initializes a training set T to an empty set (e.g., {}). At block 612, processing logic receives first sensor data for a first set of substrates processed according to one or more substrate processes at the manufacturing system. In some embodiments, processing logic can receive first sensor data from sensors at manufacturing system 300, as previously described. At block 614, processing logic obtains first metrology data for each of the first set of substrates. In some embodiments, processing logic obtains first metrology data from metrology equipment, such as metrology equipment 128 of FIG. 1, after the substrate process at the manufacturing system. At block 616, processing logic obtains second sensor data and second metrology data for a second set of substrates processed according to the substrate process at the manufacturing system. In some embodiments, the second set of substrates satisfies a specification criterion. The second set of substrates can satisfy the specification criterion in response to a determination that the second metrology data satisfies a metrology criterion (i.e., the second metrology data corresponds to metrology data for substrates that satisfy a target quality and/or consistency for the substrate process).

At block 618, processing logic generates first training data based on historical data associated with the first set of substrates processed according to the process recipe and the metrology data for each of the first set of substrates. At block 620, processing logic generates second training data including an indication of a difference between the first sensor data and the second sensor data and an indication of a difference between the first metrology data and the second metrology data. At block 622, processing logic generates a mapping between the first training data and the second training data. At block 624, processing logic adds the mapping to training set T.

As described above, the first sensor data can be collected for the first set of substrates processed according to one or more substrate processes at the manufacturing system. In some embodiments, the first sensor data can be collected for the first set of substrates processed according to multiple processes at the manufacturing system. For example, one of more first substrates of the first set of substrates can be processed according to a first substrate process and one or more second substrates of the first set of substrates can be processed according to a second substrate process. In such embodiments, processing logic can generate an additional mapping between sensor data collected for the one or more first substrates during the first substrate process and sensor data collected for the one or more second substrates during the second substrate process. Processing logic can add the additional mapping to training set T, in accordance with embodiments described herein.

At block 626, processing logic determines whether the training set, T, includes a sufficient amount of training data to train a machine learning model. It should be noted that in some implementations, the sufficiency of training set T can be determined based simply on the number of mappings in the training set, while in some other implementations, the sufficiency of training set T can be determined based on one or more other criteria (e.g., a measure of diversity of the training examples, etc.) in addition to, or instead of, the number of input/output mappings. Responsive to determining the training set does not include a sufficient amount of training data to train the machine learning model, method 600 returns to block 612. Responsive to determining the training set, T, includes a sufficient amount of training data to train the machine learning model, method 600 continues to block 628.

At block 628, processing logic provides training set T to train the machine learning model. In one implementation, the training set T is provided to training engine 182 of server machine 180 to perform the training. In the case of a neural network, for example, input values of a given input/output mapping are input to the neural network, and output values of the input/output mapping are stored in the output nodes of the neural network. The connection weights in the neural network are then adjusted in accordance with a learning algorithm (e.g., backpropagation, etc.), and the procedure is repeated for the other input/output mappings in the training set T. After block 628, machine learning model 190 can be used to predict a first amount of drift of a first set of parameter values for the first set of substrates from a target set of parameters for the first set of substrates, in accordance with embodiments described above. Machine learning model 190 can also be used to predict a second amount of drift of the first set of parameter values for the first set of substrates from a second set of parameter values for a second set of substrates that are processed prior to the first set of substrates.

Figure 7:
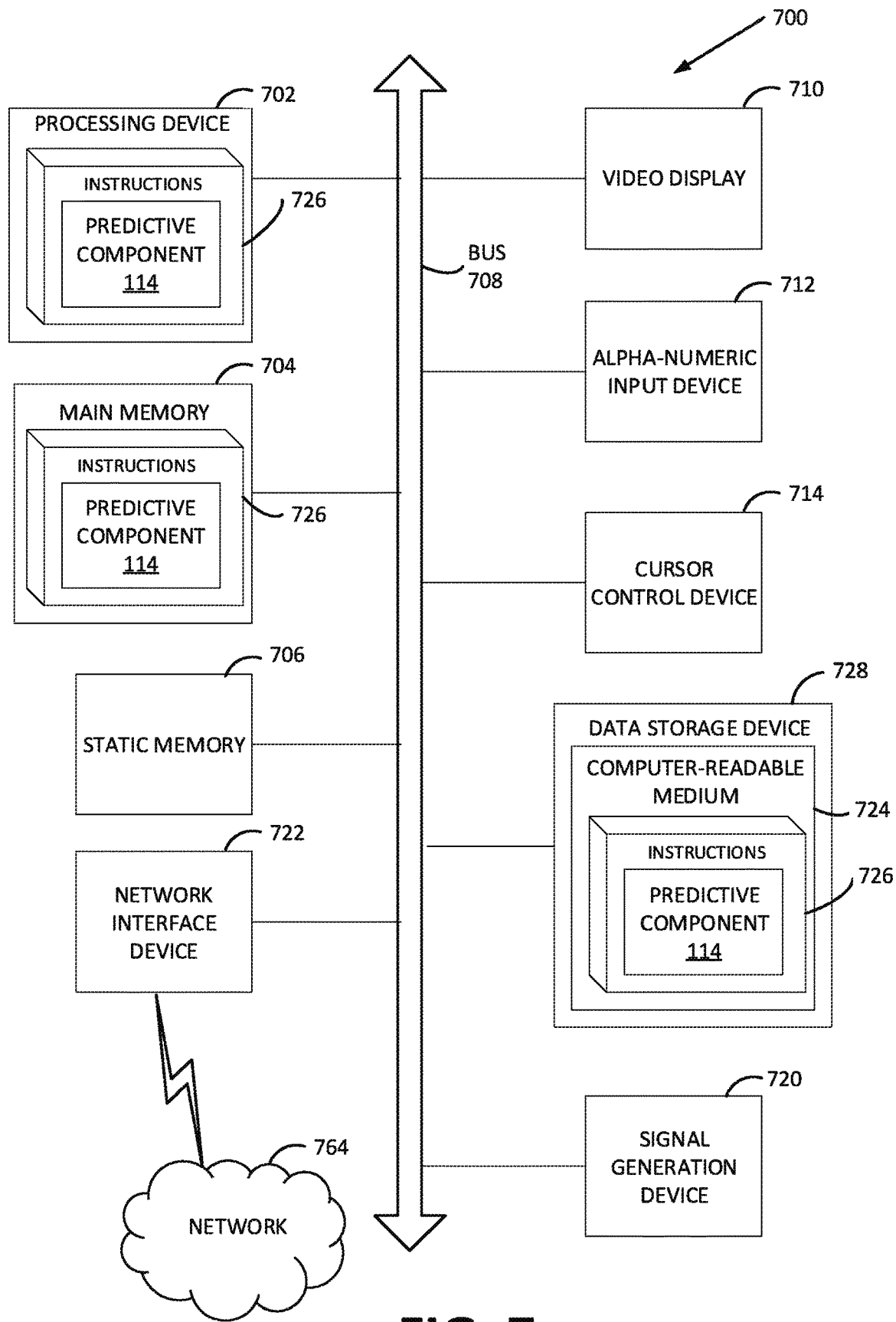
FIG. 7 depicts a block diagram of an illustrative computer system operating in accordance with one or more aspects of the present disclosure.

FIG. 7 depicts a block diagram of an illustrative computer system operating in accordance with one or more aspects of the present disclosure. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet computer, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In embodiments, computing device 1100 may correspond to system controller 328 of FIG. 3 or another processing device of manufacturing system 100.

The example computing device 700 includes a processing device 702, a main memory 704 (e.g., read-only memory (ROM), flash memory, dynamic random access memory (DRAM) such as synchronous DRAM (SDRAM), etc.), a static memory 706 (e.g., flash memory, static random access memory (SRAM), etc.), and a secondary memory (e.g., a data storage device 728), which communicate with each other via a bus 708.

Processing device 702 may represent one or more general-purpose processors such as a microprocessor, central processing unit, or the like. More particularly, the processing device 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. Processing device 702 may also be or include a system on a chip (SoC), programmable logic controller (PLC), or other type of processing device. Processing device 702 is configured to execute the processing logic for performing operations and steps discussed herein.

The computing device 700 may further include a network interface device 722 for communicating with a network 764. The computing device 700 also may include a video display unit 710 (e.g., a liquid crystal display (LCD) or a cathode ray tube (CRT)), an alphanumeric input device 712 (e.g., a keyboard), a cursor control device 714 (e.g., a mouse), and a signal generation device 720 (e.g., a speaker).

The data storage device 728 may include a machine-readable storage medium (or more specifically a non-transitory computer-readable storage medium) 724 on which is stored one or more sets of instructions 726 embodying any one or more of the methodologies or functions described herein. Wherein a non-transitory storage medium refers to a storage medium other than a carrier wave. The instructions 726 may also reside, completely or at least partially, within the main memory 704 and/or within the processing device 702 during execution thereof by the computer device 700, the main memory 704 and the processing device 702 also constituting computer-readable storage media.

The computer-readable storage medium 724 may also be used to store model 190 and data used to train model 190. The computer readable storage medium 724 may also store a software library containing methods that call model 190. While the computer-readable storage medium 724 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing or encoding a set of instructions for execution by the machine and that cause the machine to perform any one or more of the methodologies of the present disclosure. The term "computer-readable storage medium" shall accordingly be taken to include, but not be limited to, solid-state memories, and optical and magnetic media.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
   providing, as input to a trained machine learning model, data collected by a plurality of sensors at a manufacturing system during a performance of a current process for a first set of substrates at the manufacturing system;
   obtaining one or more outputs from the trained machine learning model;
   extracting, from the one or more outputs:
      a first amount of drift of a first set of parameter values for the first set of substrates from a target set of parameter values for the first set of substrates, and
      a second amount of drift of each of the first set of parameter values for the first set of substrates from a corresponding parameter value of a second set of parameter values for a second set of substrates processed according to the current process at the manufacturing system prior to the performance of the current process for the first set of substrates;
   assigning a substrate health rating for each of the first set of substrates based on the first amount of drift and a sensor health rating for each of the plurality of sensors at the manufacturing system based on the second amount of drift; and
   at least one of: (a) transmitting an indication of the substrate health rating and the sensor health rating for each of the plurality of sensors to a client device connected to the manufacturing system, or (b) displaying the substrate health rating and the sensor health rating.

2. The method of claim 1, wherein assigning the substrate health rating for each of the first set of substrates comprises:
   responsive to determining that the first amount of drift satisfies a first drift criterion, assigning a first substrate health rating to each of the first set of substrates, wherein a respective substrate having the first substrate health rating corresponds to a substrate that satisfies at least one of a target quality or a target consistency for the current process; and
   responsive to determining that the first amount of drift does not satisfy the first drift criterion, assigning a second substrate health rating to each of the first set of substrates, wherein the respective substrate having the second substrate health rating corresponds to a substrate that does not satisfy the target quality or the target consistency for the current process.

3. The method of claim 1, wherein each of the first set of parameter values and corresponding parameter values of the second set of parameter values correspond to a particular sensor of the manufacturing system, and wherein assigning the sensor health rating for each of the plurality of sensors comprises:
   responsive to determining that the second amount of drift of a first parameter value of the first set of parameter values from a corresponding second parameter value of the second set of parameter values satisfies a second drift criterion, assigning a first sensor health rating to the particular sensor associated with the first parameter value and the corresponding second parameter value, wherein a respective sensor associated with the first sensor health rating corresponds to an operative sensor; and
   responsive to determining that the second amount of drift of the first parameter value of from the second parameter value does not satisfy the second drift criterion, assigning a second sensor health rating to the particular sensor, wherein the respective sensor associated with the second sensor health rating corresponds to a defective sensor.

4. The method of claim 1, further comprising:
   providing, as additional input to the trained machine learning model, an indication of at least one of a process type for the current process performed for the first set of substrates, a substrate type for each of the first set of substrates, or an equipment type for one or more equipment at the manufacturing system, wherein the target set of parameter values for the first set of substrates corresponds to the at least one of the process type, the substrate type, or the equipment type.

5. The method of claim 1, wherein the first amount of drift corresponds to a first aggregation metric for a first plurality of distance values for the plurality of sensors at the manufacturing system, wherein each of the first plurality of distance values indicates a distance between data collected by a respective sensor of the plurality of sensors during the current process performed for the first set of substrates and prior data collected by the respective sensor during a prior process performed for a prior set of substrates.

6. The method of claim 5, wherein the second amount of drift corresponds to a second aggregation metric for a second plurality of distance values for the first set of substrates, wherein each of the second plurality of distance values indicates a distance between one or more first parameter values for a respective substrate of the first set of substrates and one or more second parameter values for an additional respective substrate of the second set of substrates processed according to the current process prior to the performance of the current process for the respective substrate.

7. The method of claim 6, wherein the first aggregation metric and the second aggregation metric correspond to at least one of: a LP-norm transformation aggregation metric, a statistical moment aggregation metric, a distribution aggregation metric, a divergence aggregation metric, a kernel distance aggregation metric, a co-expression measure aggregation metric, or a loss function aggregation metric.

8. The method of claim 6, wherein the first plurality of distance values and the second plurality of distance values correspond to at least one of: a z-score distance value, a multi-dimension based distance value, a distribution test based distance value, a likelihood distance value, a Gaussian mixture model distance value, or a clustering based centroid distance value.

9. The method of claim 1, wherein the one or more outputs comprise: (i) prior data for a prior process performed for a prior set of substrates at the manufacturing system, wherein the prior data corresponds to prior sensor data collected by the plurality of sensors during the prior process and prior metrology data for the prior set of substrates, and (ii) a level of confidence that the first set of substrates being processed according to the current process is associated with the prior metrology data for the prior set of substrates.

10. The method of claim 1, wherein the trained machine learning model is trained with an input-output mapping comprising an input and an output, the input based on prior data collected by the plurality of sensors at the manufacturing system during a prior process performed for a prior set of substrates at the manufacturing system, and the output identifying a prior set of parameter values for the second set of substrates.

11. A system comprising:
a memory component configured to store a trained machine learning model; and
a processing device coupled to the memory component, the processing device to:
provide, as input to the trained machine learning model, data collected by a plurality of sensors at a manufacturing system during a performance of a current process for a first set of substrates at the manufacturing system;

obtain one or more outputs from the trained machine learning model;
extract, from the one or more outputs:
a first amount of drift of a first set of parameter values for the first set of substrates from a target set of parameter values for the first set of substrates, and
a second amount of drift of each of the first set of parameter values for the first set of substrates from a corresponding parameter value of a second set of parameter values for a second set of substrates processed according to the current process at the manufacturing system prior to the performance of the current process for the first set of substrates;
assign a substrate health rating for each of the first set of substrates based on the first amount of drift and a sensor health rating for each of the plurality of sensors at the manufacturing system based on the second amount of drift; and
at least one of: (a) transmit an indication of the substrate health rating and the sensor health rating for each of the plurality of sensors to a client device connected to the manufacturing system, or (b) display the substrate health rating and the sensor health rating.

12. The system of claim 11, wherein to assign the substrate health rating for each of the first set of substrates, the processing device is to:
responsive to determining that the first amount of drift satisfies a first drift criterion, assign a first substrate health rating to each of the first set of substrates, wherein a respective substrate having the first substrate health rating correspond to a substrate that satisfies at least one of a target quality or a target consistency for the current process; and
responsive to determining that the first amount of drift does not satisfy the first drift criterion, assign a second substrate health rating to each of the first set of substrates, wherein the respective substrate having the second substrate health rating corresponds to a substrate that does not satisfy the target quality or the target consistency for the current process.

13. The system of claim 11, wherein each of the first set of parameter values and corresponding parameter values of the second set of parameter values correspond to a particular sensor of the manufacturing system, and wherein to assign the sensor health rating for each of the plurality of sensors, the processing device is to:
responsive to determining that the second amount of drift of a first parameter value of the first set of parameter values from a second parameter value of the second set of parameter values satisfies a second drift criterion, assign a first sensor health rating to the particular sensor associated with the first parameter value and the second parameter value, wherein a respective sensor associated with the first sensor health rating corresponds to an operative sensor; and
responsive to determining that the second amount of drift of the first parameter value of from the second parameter value does not satisfy the second drift criterion, assign a second sensor health rating to the particular sensor, wherein a respective sensor associated with the second sensor health rating corresponds to a defective sensor.

14. The system of claim 11, wherein the processing device is further to:
provide, as additional input to the trained machine learning model, an indication of at least one of a process type for the current process performed for the first set of substrates, a substrate type for each of the first set of substrates, or an equipment type for one or more equipment at the manufacturing system,
wherein the target set of parameter values for the first set of substrates corresponds to the at least one of the process type, the substrate type, or the equipment type.

15. The system of claim 11, wherein the first amount of drift corresponds to a first aggregation metric for a first plurality of distance values for the plurality of sensors at the manufacturing system, wherein each of the first plurality of distance values indicates a distance between data collected by a respective sensor of the plurality of sensors during the current process performed for the first set of substrates and prior data collected by the respective sensor during a prior process performed for a prior set of substrates.

16. The system of claim 15, wherein the second amount of drift corresponds to a second aggregation metric for a second plurality of distance values for the first set of substrates, wherein each of the second plurality of distance values indicates a distance between one or more first parameter values for a respective substrate of the first set of substrates and one or more second parameter values for an additional respective substrate of the second set of substrates processed according to the current process prior to the performance of the current process for the respective substrate.

17. A non-transitory computer readable medium comprising instructions that, when executed by a processing device, cause the processing device to:
provide, as input to a trained machine learning model, data collected by a plurality of sensors at a manufacturing system during a performance of a current process for a first set of substrates at the manufacturing system;
obtain one or more outputs from the trained machine learning model;
extract, from the one or more outputs:
a first amount of drift of a first set of parameter values for the first set of substrates from a target set of parameter values for the first set of substrates, and
a second amount of drift of each of the first set of parameter values for the first set of substrates from a corresponding parameter value of a second set of parameter values for a second set of substrates processed according to the current process at the manufacturing system prior to the performance of the current process for the first set of substrates;
assign a substrate health rating for each of the first set of substrates based on the first amount of drift and a sensor health rating for each of the plurality of sensors at the manufacturing system based on the second amount of drift; and
at least one of: (a) transmit an indication of the substrate health rating and the sensor health rating for each of the plurality of sensors to a client device connected to the manufacturing system, or (b) display the substrate health rating and the sensor health rating.

18. The non-transitory computer readable medium of claim 17, wherein to assign the substrate health rating for each of the first set of substrates, the processing device is to:
responsive to determining that the first amount of drift satisfies a first drift criterion, assign a first substrate health rating to each of the first set of substrates, wherein a respective substrate having the first substrate health rating correspond to a substrate that satisfies at least one of a target quality or a target consistency for the current process; and
responsive to determining that the first amount of drift does not satisfy the first drift criterion, assign a second substrate health rating to each of the first set of substrates, wherein the respective substrate having the second substrate health rating corresponds to a substrate that does not satisfy the target quality or the target consistency for the current process.

19. The non-transitory computer readable medium of claim 17, wherein each of the first set of parameter values and corresponding parameter values of the second set of parameter values correspond to a particular sensor of the manufacturing system, and wherein to assign the sensor health rating for each of the plurality of sensors, the processing device is to:
responsive to determining that the second amount of drift of a first parameter value of the first set of parameter values from a second parameter value of the second set of parameter values satisfies a second drift criterion, assign a first sensor health rating to the particular sensor associated with the first parameter value and the second parameter value, wherein a respective sensor associated with the first sensor health rating corresponds to an operative sensor; and
responsive to determining that the second amount of drift of the first parameter value of from the second parameter value does not satisfy the second drift criterion, assign a second sensor health rating to the particular sensor, wherein a respective sensor associated with the second sensor health rating corresponds to a defective sensor.

20. The non-transitory computer readable medium of claim 17, wherein the processing device is further to:
provide, as additional input to the trained machine learning model, an indication of at least one of a process type for the current process performed for the first set of substrates, a substrate type for each of the first set of substrates, or an equipment type for one or more equipment at the manufacturing system,
wherein the target set of parameter values for the first set of substrates corresponds to the at least one of the process type, the substrate type, or the equipment type.

* * * * *